United States Patent [19]

Uehara et al.

[11] Patent Number: 4,640,721
[45] Date of Patent: Feb. 3, 1987

[54] METHOD OF FORMING BIPOLAR TRANSISTORS WITH GRAFT BASE REGIONS

[75] Inventors: Keijiro Uehara, Sagamihara; Hisayuki Higuchi, Kokubunji; Akio Hayasaka, Higashiyamato, all of Japan

[73] Assignee: Hitachi, Ltd., Tokyo, Japan

[21] Appl. No.: 741,525

[22] Filed: Jun. 5, 1985

[30] Foreign Application Priority Data

Jun. 6, 1984 [JP] Japan .................. 59-114562
Jun. 6, 1984 [JP] Japan .................. 59-114563

[51] Int. Cl.$^4$ ............................ H01L 21/385
[52] U.S. Cl. ...................... 148/188; 148/187; 29/576 B; 29/578; 29/591
[58] Field of Search ............. 148/188, 187, 1.5; 29/576 B, 578, 591

[56] References Cited

U.S. PATENT DOCUMENTS

| | | | |
|---|---|---|---|
| 4,431,460 | 2/1984 | Barson et al. ................. | 148/1.5 |
| 4,481,706 | 11/1984 | Roche ............................ | 29/578 X |
| 4,492,008 | 1/1985 | Anantha et al. .............. | 29/578 X |
| 4,507,171 | 3/1985 | Bhatia et al. ................. | 148/187 X |
| 4,512,075 | 4/1985 | Vora .............................. | 29/576 B |
| 4,531,282 | 7/1985 | Sakai et al. ................... | 29/578 |
| 4,545,114 | 10/1985 | Ho et al. ....................... | 29/578 X |
| 4,546,536 | 10/1985 | Anantha et al. .............. | 148/1.5 X |

Primary Examiner—George T. Ozaki
Attorney, Agent, or Firm—Antonelli, Terry & Wands

[57] ABSTRACT

After an end part of a polycrystalline silicon film has been oxidized from an exposed side surface thereof, a silicon dioxide film formed is removed, and an opening thus provided is used for diffusing an impurity into a semiconductor substrate so as to form a graft base region.

This measure is effective for fabricating a semiconductor device of small required area at high precision.

15 Claims, 22 Drawing Figures

METHOD OF FORMING BIPOLAR TRANSISTORS WITH GRAFT BASE REGIONS

BACKGROUND OF THE INVENTION

The present invention relates to a method of producing a semiconductor device, and more particularly to a method of producing a semiconductor device by which the semiconductor device having a high density of integration can be formed at high precision and with favorable reproducibility.

With increase in the density of integration of a semiconductor device, a method of producing transistors on the basis of the self-alignment technique has been proposed for the purpose of decreasing a required area and enhancing a manufacturing precision as disclosed in, for example, Japanese Patent Application Publication No. 55-27469.

The prior-art method of production based on the self-alignment technique, however, has the problems that the dimensional accuracy is not high and that the reproducibility is poor, resulting in a low available percentage. It has been desired to solve these problems.

SUMMARY OF THE INVENTION

An object of the present invention is to solve the problems of the prior art and to provide a method of producing a semiconductor device the required area of which is small and the dimensional accuracy and reproducibility of which are satisfactorily high.

In order to accomplish the object, according to the present invention, the end part of a polycrystalline silicon film is oxidized sideways, the resulting silicon dioxide is thereafter removed, and an opening thus formed is utilized for diffusing an impurity into a semiconductor substrate therethrough, whereby a graft base region is formed.

DETAILED DESCRIPTION OF THE PREFERRED EMBODIMENTS

As summarized before, the present invention forms a graft base region by oxidizing the end part of a polycrystalline silicon film from the side surface thereof, subsequently removing the resulting silicon dioxide film and then diffusing an impurity into the surface region of a semiconductor substrate through an opening thus formed.

The oxidation of the polycrystalline silicon film and the diffusion of the impurity can be controlled very precisely by adjusting temperatures and periods of time. Therefore, a semiconductor device having a high density of integration can be produced at high precision and with favorable reproducibility.

The prior-art method utilizing the self-alignment technique is, for example, such that after a multilayer film has been formed on a semiconductor substrate, the intermediate layer thereof is side-etched so as to use the magnitude of the side etching for the width of a pattern, or that the lower layer of the multilayer film is undercut to form a pendent roof, the width of a pattern being determined by the length of the pendent roof.

All such methods, however, are poor in reproducibility and have been difficult of application to the mass production of a semiconductor device whose available percentage is deemed very important.

In contrast, the present invention produces the semiconductor device in accordance with the self-alignment technique employing the magnitude of the oxidation of the silicon film (the width of the silicon dioxide film formed) and the length of the diffusion, which can be controlled at high precision as stated above. Therefore, the invention solves the problems involved in the conventional self-alignment techniques and is well suited to the mass production of the semiconductor device.

EXAMPLE 1

Figure 1A:
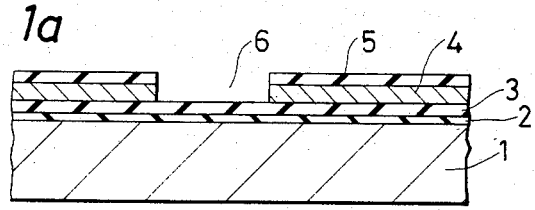
FIGS. 1a to 1i are flow diagrams showing an embodiment of the present invention.

As shown in FIG. 1a, on an N-type silicon substrate 1, there were successively stacked and formed a silicon dioxide film 2 having a thickness of 50 nm, a silicon nitride film 3 having a thickness of 100 nm, a polycrystalline silicon film 4 heavily doped with boron as a P-type impurity and having a thickness of 200 nm, and a silicon nitride film 5 having a thickness of 100 nm.

Using a well-known photoetching technique, a desired part of the silicon nitride film 5, as well as the polycrystalline silicon film 4, was selectively removed to form a window 6.

Figure 1B:
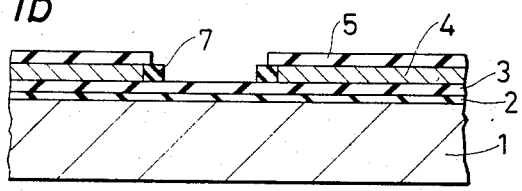

A heat treatment at 1,000° C. for 20 minutes was conducted in oxygen containing water vapor. Thus, the side part of the polycrystalline silicon film 4 was oxidized to form a silicon dioxide film 7 having a width of 200 nm as shown in FIG. 1b.

Figure 1C:
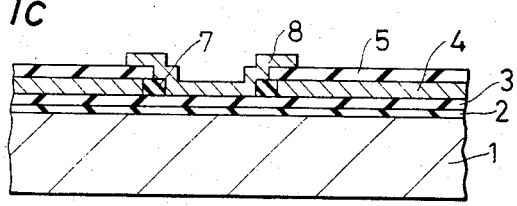

Subsequently, as shown in FIG. 1c, a polycrystalline silicon film 8 containing no impurity was formed on the whole surface of the resultant structure, whereupon the unnecessary part thereof was removed.

The exposed part of the silicon nitride film 5 was etched and removed, and the part thereof covered with the polycrystalline silicon film 8 was also removed by overetching. The etching at this step is carried out with an etchant which dissolves silicon nitride to a great extent but which does not dissolve polycrystalline silicon and silicon dioxide to any great extent. In this example, hot phosphoric acid which presents a sufficiently high ratio of etching rates was used as the etchant. The period of time of the etching is determined by the width of the silicon nitride film 5 underlying the polycrystalline silicon film 8, and etching for 100 minutes was performed at 160° C. in this example.

Although not shown in the figures, a thin silicon dioxide film formed at the stage of doping with boron exists on the front surface of the polycrystalline silicon film 4. Owing to the thin silicon dioxide film, the polycrystalline silicon film 4 is further prevented from being etched by the hot phosphoric acid.

Figure 1D:
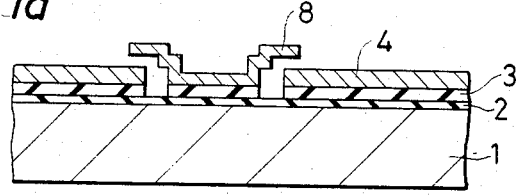

As shown in FIG. 1d, after the removal of the silicon nitride film 5, the silicon dioxide film 7 formed by the oxidation of the side part of the polycrystalline silicon film 4 was etched and removed, whereupon the underlying part of the silicon nitride film 3 was etched and removed with hot phosphoric acid.

Figure 1E:
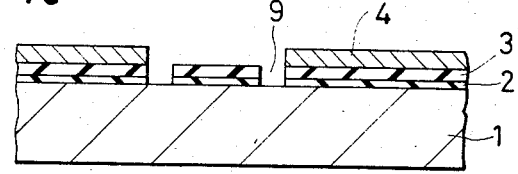

After the polycrystalline silicon film 8 was removed, the exposed part of the silicon dioxide film 2 was removed to expose the silicon substrate 1 through a minute opening 9 as illustrated in FIG. 1e.

The removal of the polycrystalline silicon film 8 was conducted with an aqueous solution of potassium hydroxide at a concentration of 40%. When this alkaline etchant is employed, only the undoped polycrystalline silicon film 8 is selectively etched, with no appreciable etching of the polycrystalline silicon film 4 containing boron in large amounts.

It is needless to say that the width of the minute opening 9 corresponds to the width of the silicon dioxide film 7.

Figure 1F:
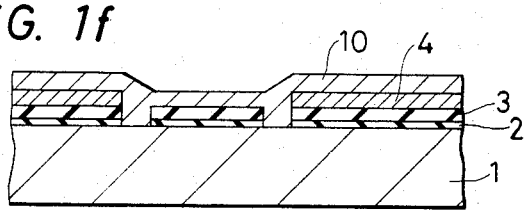
Figure 1G:
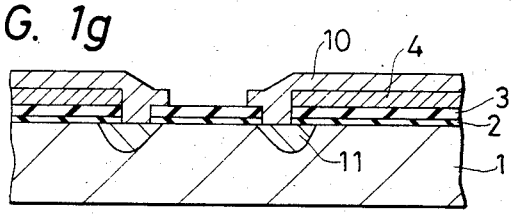

Next, as shown in FIG. 1f, a polycrystalline silicon film 10 was formed on the whole surface of the resultant structure, and a heat treatment was conducted, whereby the boron contained in the polycrystalline silicon film 4 was diffused into the polycrystalline silicon film 10. On this occasion, the boron diffused also into the semiconductor substrate 1 through the minute opening 9, so that a boron doped region (graft base region) 11 was formed as shown in FIG. 1g.

As regards the diffusion of the boron by the heat treatment, annealing conditions are selected so that the boron may arrive via the base contact region at a part on the edge of the silicon nitride film 3 left within the window 6. In this example, the heat treatment was conducted in a nitrogen atmosphere.

At the next step, etching was carried out using the aforementioned solution of potassium hydroxide. Then, since no boron was diffused in the part of the polycrystalline silicon film 10 overlying an emitter region (15 in FIG. 1i), this part of the polycrystalline silicon film 10 was selectively removed as shown in FIG. 1g.

Figure 1H:
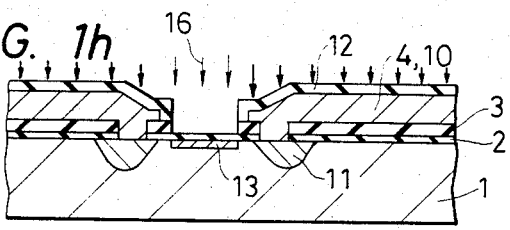

As shown in FIG. 1h, the surface of the polycrystalline silicon film 10 was oxidized to form a silicon dioxide film 12, whereupon the exposed part of the silicon nitride film 3 was removed.

A boron doped region 13 was formed by introducing boron 16 as a P-type impurity by ion implantation.

Figure 1I:
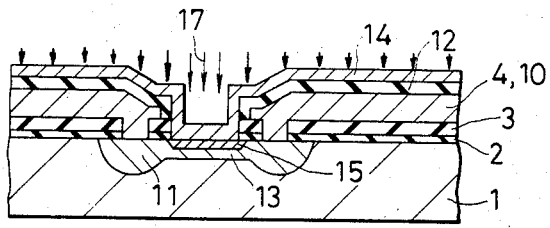

As shown in FIG. 1i, a polycrystalline silicon film 14 was formed after removing the exposed part of the silicon dioxide film 2. Further, arsenic 17 was introduced into the polycrystalline silicon film 14 by ion implantation, and the emitter region 15 was formed by heating.

On this occasion, the boron atoms within the boron doped regions 11 and 13 diffused into the substrate 1, whereby the intrinsic base region 13 and the graft base region 11 connected with each other were formed as shown in FIG. 1i.

When interconnections, a protective film, etc. (not shown) are thereafter formed by well-known methods, an N-P-N bipolar transistor, the base lead-out electrode of which is the polycrystalline silicon film at 4 and 10, is finished up.

In order to facilitate understanding, portions which are not directly pertinent to the present invention, such as a buried layer, an insulator film for isolating elements, and an epitaxial silicon film formed on the substrate, have not been illustrated and described. Needless to say, the actual semiconductor device has them.

In the actual process for manufacturing an LSI, the N-type substrate can of course be replaced with a P-type substrate which is formed with an N-type buried layer and then with an N-type epitaxially-grown layer and which is provided with regions for the isolation of elements. It is also a matter of course that, after the emitters, base and collector contacts are formed, the interconnections are laid.

EXAMPLE 2

In Example 1, the impurity doped region to become the intrinsic base region was formed at a very late state (FIG. 1h). In contrast, the present example is characterized in that an impurity to form a base region is introduced at a very early stage.

Figure 2A:
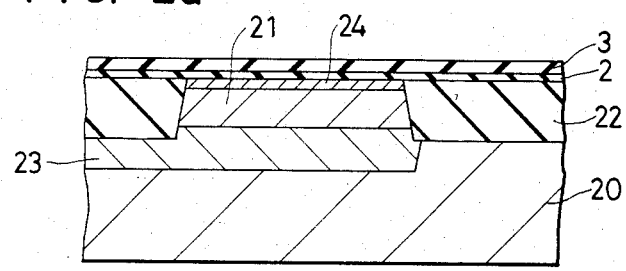
FIGS. 2a to 2h are flow diagrams showing another embodiment of the present invention.

As shown in FIG. 2a, an N-type epitaxial silicon layer 21, a thick silicon dioxide film 22 for the isolation between elements and an N+-type buried layer 23 were formed on a P-type silicon substrate 20 by well-known processes.

After a silicon dioxide film 2 and a silicon nitride film 3 were stacked and formed likewise to those of Example 1, the surface region of the N-type epitaxial layer 21 was doped with boron by ion implantation so as to form a boron doped region 24. The boron doping may well be performed by well-known thermal diffusion instead of ion implantation.

Figure 2B:
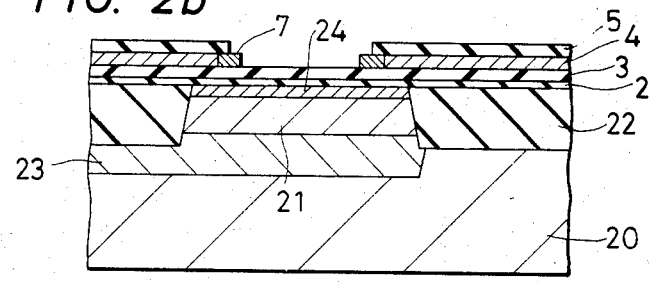
Figure 2C:
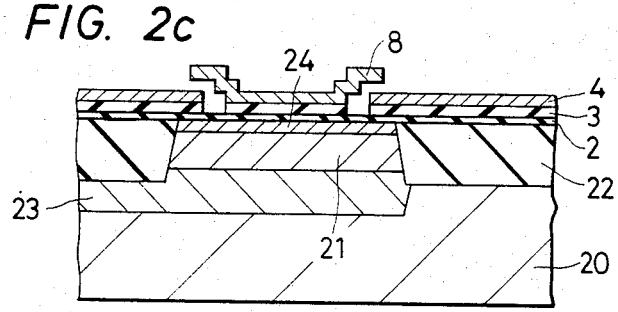
Figure 2D:
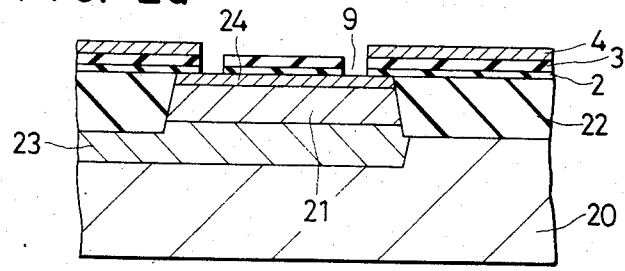
Figure 2E:
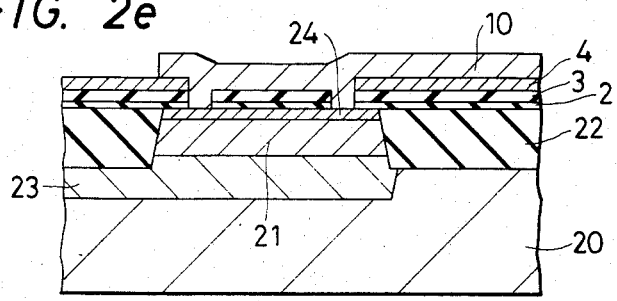

A polycrystalline silicon film 4 and a silicon nitride film 5 were formed on the silicon nitride film 3 and were subsequently processed as in Example 1, to effect the formation of a window and the oxidation of the end part of the polycrystalline silicon 4. Then, a structure illustrated in FIG. 2b was obtained.

Figure 2F:
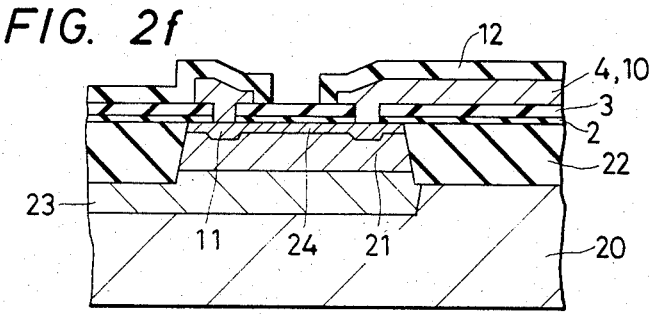

Thenceforth, steps similar to those of Example 1 were successively carried out to form a structure shown in FIG. 2f.

Steps illustrated in FIGS. 2b, 2c, 2d, 2e and 2f correspond to those illustrated in FIGS. 1b, 1d, 1e, 1f and 1g, respectively.

As understood by comparing FIG. 1g and FIG. 2f, when boron was diffused through the minute opening 9, only the boron doped region (graft base region) 11 was formed in the case of Example 1, whereas in the present example, the graft base region 11 was formed in connection with the boron doped region 24, which region 24 had been formed by a previous step (FIG. 2a).

Figure 2G:
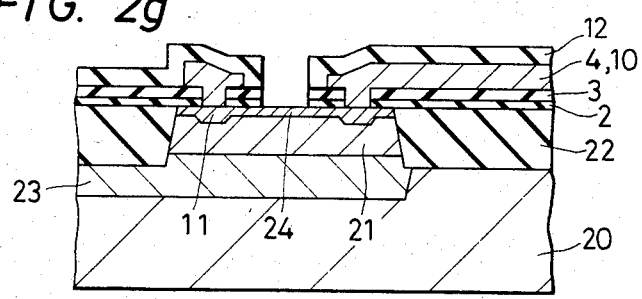

As illustrated in FIG. 2g, parts of the silicon nitride film 3 and the silicon dioxide film 2 were etched and removed through a window in the silicon dioxide film 12 formed at the top of the resultant structure.

The surfaces of the epitaxial silicon layer 21 and the polycrystalline silicon film at 4 and 10 were oxidized to form a silicon dioxide film (continuous to the silicon dioxide film 12), whereupon a polycrystalline silicon film 25 heavily doped with arsenic was formed. By conducting a heat treatment, the arsenic contained in the polycrystalline silicon film 25 was diffused into the epitaxial silicon layer 21. Then, an emitter region 15 was formed as shown in FIG. 2h.

On this occasion, likewise to the case of Example 1, the boron introduced by the previous step was also driven in, whereby the intrinsic base region 24 and the graft base region 11 connected with each other were finished up.

Needless to say, the emitter 15 may well be formed in such a way that after the part of the first silicon nitride film 3 exposed by the step illustrated in FIG. 2f and the underlying part of the first silicon dioxide film 2 have been removed, a polycrystalline silicon film 14 heavily doped with a first conductivity type impurity is formed and heated as illustrated in FIG. 1i.

Figure 2H:
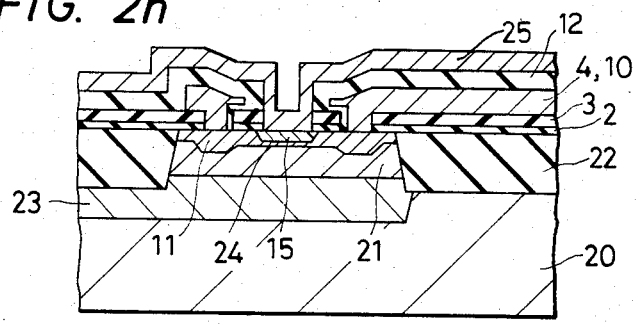

This measure is preferable in practical use because, among the steps illustrated in FIG. 2h, the step of oxidizing the exposed surfaces of the polycrystalline silicon film 4, 10 and the epitaxial silicon layer 21 is dispensed with.

The characterizing feature of the present example is that the impurity doped region in which the intrinsic base is to be formed is formed beforehand, whereupon the desired part thereof is further doped with an impurity of the same conductivity type thereby to form the graft base region.

Therefore, even when the thicknesses of the base and the emitter region become small in the extreme, any possibility that the intrinsic base region and the graft base region will separate is avoided, and they are reliably connected.

This is very advantageous for fabricating a semiconductor device of very high integration density at a high available percentage.

EXAMPLE 3

As described above, in the present invention, as illustrated in FIG. 1h by way of example, the polycrystalline silicon film 4, 10 to become the base lead-out electrode has its surface oxidized thereby to form the silicon dioxide film 12 for the insulating isolation between the base lead-out electrode and an emitter lead-out electrode.

Figure 3A:
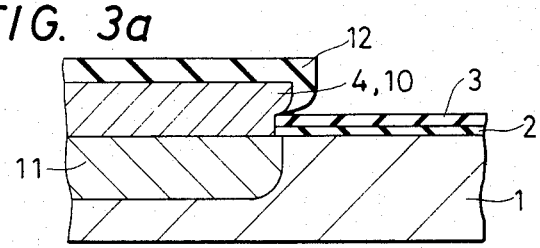
FIGS. 3a and 3b and FIGS. 4a to 4c are diagrams for explaining still another embodiment of the present invention.
Figure 3B:
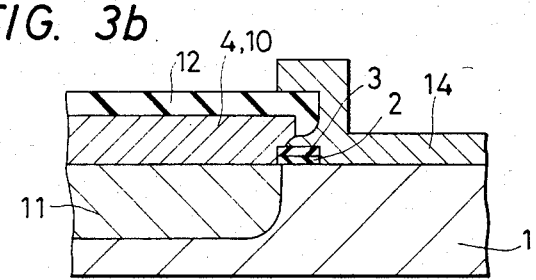

However, when annealing conditions at that time are improper, the part of the silicon dioxide film 12 lying in contact with the silicon nitride film 3 becomes extremely thin as shown in FIG. 3a, so that the polycrystalline silicon film 14 serving as the emitter lead-out electrode and the base lead-out electrode 4, 10 might short-circuit as shown in FIG. 3b.

Figure 4A:
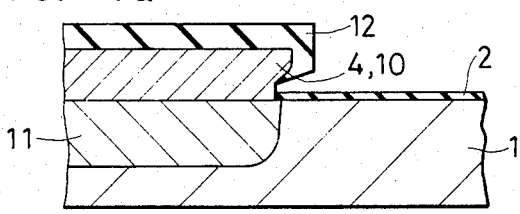
Figure 4B:
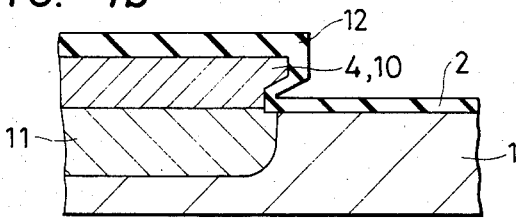
Figure 4C:
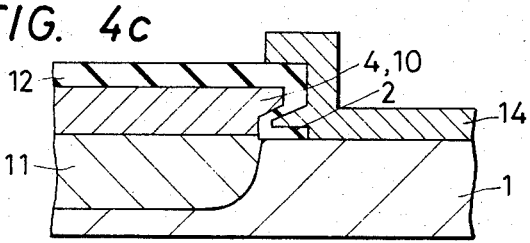

FIGS. 4a to 4c are flow diagrams illustrative of an expedient for preventing the drawback, by which the allowable ranges of the annealing conditions are conspicuously widened.

First, the silicon nitride film 3 is removed as shown in FIG. 4a. Thereafter, the resultant structure is heat-treated in an oxidizing atmosphere again.

Then, as shown in FIG. 4b, even the side part of the base lead-out electrode 4, 10 is completely covered with the silicon dioxide film 2, 12. As shown in FIG. 4c, therefore, the polycrystalline silicon film 14 formed as the emitter lead-out electrode is perfectly isolated from the polycrystalline silicon film 4, 10, and any possibility of short-circuit between the films is avoided.

What is claimed is:

1. A method of producing a semiconductor device comprising the steps of:
   (a) stacking and forming on a semiconductor substrate of a first conductivity type a first silicon dioxide film, a first silicon nitride film, a first polycrystalline silicon film heavily doped with an impurity of a second conductivity type, and a second silicon nitride film,
   (b) removing desired parts of said second silicon nitride film and said first polycrystalline silicon film, to expose a desired part of said first silicon nitride film,
   (c) oxidizing an end part of said first polycrystalline film from an exposed side part thereof, to form a silicon dioxide film of desired width in contiguity to a side part of said first polycrystalline silicon film,
   (d) selectively forming a second polycrystalline silicon film on a surface of the structure formed in step (c), so as to be formed over the silicon dioxide film of desired width,
   (e) successively removing said second silicon nitride film, so as to expose said silicon dioxide film of desired width, said silicon dioxide film of desired width, and parts of said first silicon nitride film underlying said silicon dioxide film,
   (f) removing said second polycrystalline silicon film,
   (g) removing exposed parts of said first silicon dioxide film, to form an opening,
   (h) forming a third polycrystalline silicon film on a surface of the resultant structure of step (g), so as to extend continuously from said opening to being in contact with the first polycrystalline silicon film,
   (i) heating the resultant structure, to diffuse the impurity contained in said first polycrystalline silicon film into a desired part of said third polycrystalline silicon film and simultaneously to diffuse the impurity into said semiconductor substrate through said opening, so as to form a graft base, and
   (j) successively doping a surface region of said semiconductor substrate with an impurity of the second conductivity type and an impurity of the first conductivity type to form an intrinsic base and an emitter.

2. A method of producing a semiconductor device as defined in claim 1, wherein the step (j) of successively doping includes the substeps of:
   (k) removing a part of said third polycrystalline silicon film formed on a region for forming an emitter therein, so as to expose a part of the first silicon nitride film,
   (l) removing an exposed part of said first silicon nitride film, so as to expose a part of the first silicon dioxide film,
   (m) doping a surface region of said semiconductor substrate with an impurity of the second conductivity type through an exposed part of said first silicon dioxide film,
   (n) removing the exposed part of said first silicon dioxide film,
   (o) forming a fourth polycrystalline silicon film heavily doped with an impurity of the first conductivity type, so as to cover at least an exposed surface part of said semiconductor substrate, exposed by removal of the first silicon dioxide film, and
   (p) heating the resultant structure, to diffuse the first conductivity type impurity contained in said fourth polycrystalline silicon film into said semiconductor substrate.

3. A method of producing a semiconductor device as defined in claim 2, further comprising between said steps (l) and (m) the step of:
   (o) heating the resultant structure in an oxidizing atmosphere, to oxidize at least a side part of said first polycrystalline silicon film.

4. A method of producing a semiconductor device as defined in claim 1, wherein the second polycrystalline silicon film is selectively formed so as to cover the silicon dioxide film.

5. A method of producing a semiconductor device as defined in claim 4, wherein the second polycrystalline silicon film is selectively formed so as to cover the silicon dioxide film and said desired part of said first silicon nitride film.

6. A method of producing a semiconductor device as defined in claim 1, wherein the second polycrystalline silicon film is selectively formed by covering the whole area of the structure formed in step (c) and removing desired parts thereof.

7. A method of producing a semiconductor device as defined in claim 1, wherein the semiconductor substrate is exposed through said opening.

8. A method of producing a semiconductor device as defined in claim 7, wherein the third polycrystalline silicon film extends continuously from in contact with the substrate in said opening to being in contact with the first polycrystalline silicon film.

9. A method of producing a semiconductor device as defined in claim 1, wherein said third polycrystalline silicon film is formed on the whole surface of the resultant structure of step (g); and wherein, in the successive doping of step (j), initially a part of said third polycrystalline silicon film on a region for forming an emitter therein is removed, and then the successive doping is performed at the position where said part of said third polycrystalline silicon film was removed.

10. A method of producing a semiconductor device comprising the steps of:
   (a) stacking and forming on a semiconductor substrate of a first conductivity type a first silicon dioxide film and a first silicon nitride film,
   (b) doping a surface region of said substrate with an impurity of a second conductivity type opposite to said first conductivity type,
   (c) stacking and forming a first polycrystalline silicon film heavily doped with an impurity of the second conductivity type, and a second silicon nitride film, on the structure formed in step (b),
   (d) removing desired parts of said second silicon nitride film and said first polycrystalline silicon film, to expose a desired part of said first silicon nitride film,
   (e) oxidizing an end part of said first polycrystalline silicon film from an exposed side part thereof, to form a silicon dioxide film of desired width in contiguity to a side part of said first polycrystalline silicon film,
   (f) selectively forming a second polycrystalline silicon film on a surface of the resultant structure of step (e), so as to be formed over said silicon dioxide film of desired width,
   (g) successively removing said second silicon nitride film, so as to expose said silicon dioxide film of desired width, said silicon dioxide film of desired width, and parts of said first silicon nitride film underlying said silicon dioxide film of desired width,
   (h) removing said second polycrystalline silicon film,
   (i) removing exposed parts of said first silicon dioxide film, to form an opening,
   (j) forming a third polycrystalline silicon film on a surface of the resultant structure of step (i), so as to extend continuously from said opening to being in contact with the first polycrystalline silicon film,
   (k) heating the resultant structure, to diffuse the impurity contained in said first polycrystalline silicon film into a desired part of said third polycrystalline silicon film and simultaneously to diffuse the impurity into said semiconductor substrate through said opening, so as to form a graft base region, and
   (l) doping a surface region of said semiconductor substrate with an impurity of the first conductivity type so as to form an emitter.

11. A method of producing a semiconductor device as defined in claim 10, wherein the step (l) of doping a surface region of the substrate so as to form the emitter comprises the substeps of:

(m) removing a part of said third polycrystalline silicon film formed on a region for forming an emitter therein, so as to expose a part of the first silicon nitride film,
   (n) removing an exposed part of said first silicon nitride film, so as to expose a part of the first silicon dioxide film,
   (o) removing the exposed part of said first silicon dioxide film, so as to expose the semiconductor substrate,
   (p) forming a fourth polycrystalline silicon film heavily doped with an impurity of the first conductivity type, so as to cover at least the exposed surface part of said semiconductor substrate, and
   (q) heating the resultant structure, to diffuse the first conductivity type impurity contained in said fourth polycrystalline silicon film into said semiconductor substrate.

12. A method of producing a semiconductor device as defined in claim 11, further comprising between said steps (n) and (o) the step of:
   (x) heating the resultant structure of step (n) in an oxidizing atmosphere, to oxidize at least a side part of said first polycrystalline silicon film.

13. A method of producing a semiconductor device as defined in claim 10, wherein the step (l) of doping a surface region of the substrate so as to form the emitter comprises the substeps of:
   (r) removing parts of said first silicon nitride film and said first silicon dioxide film through a position of the removed part of said second silicon dioxide film,
   (s) oxidizing exposed parts of said semiconductor substrate and said first polycrystalline silicon film, exposed after the substep (r),
   (t) exposing a surface part of said semiconductor substrate corresponding to a part for forming an emitter therein,
   (u) forming a fourth polycrystalline silicon film heavily doped with an impurity of the first conductivity type, so as to cover at least the exposed surface part of said semiconductor substrate, and
   (v) heating the resultant structure, to diffuse the first conductivity type impurity contained in said fourth polycrystalline silicon film into said semiconductor substrate, so as to form said emitter.

14. In the fabrication of a semiconductor device, a method of introducing impurities into a semiconductor substrate so as to form impurity regions therein, comprising the steps of:
   (a) stacking and forming on a semiconductor substrate of a first conductivity type a first silicon dioxide film, a first silicon nitride film, a first polycrystalline silicon film heavily doped with an impurity of a second conductivity type, and a second silicon nitride film,
   (b) removing desired parts of said second silicon nitride film and said first polycrystalline silicon film, to expose a desired part of said first silicon nitride film,
   (c) oxidizing an end part of said first polycrystalline silicon film from an exposed side part thereof, to form a silicon dioxide film of desired width in contiguity to a side part of said first polycrystalline silicon film,
   (d) selectively forming a second polycrystalline silicon film so as to be formed over said silicon dioxide film of desired width, (e) successively removing said second silicon nitride film so as to expose said silicon dioxide film, said silicon dioxide film, part of said first silicon nitride film underlying said silicon dioxide film, said second polycrystalline silicon film, and said first silicon oxide film, to form an opening, (f) forming a third polycrystalline silicon film on a surface of the resultant structure of step (e), said third polycrystalline silicon film extending from said opening to be in contact with said first polycrystalline silicon film, and (g) heating the resultant structure of step (f), to diffuse the impurity contained in said first polycrystalline silicon film into a desired part of said third polycrystalline silicon film and simultaneously to diffuse the impurity into said semiconductor substrate through said opening, to thereby form an impurity region in the substrate.

15. The method of introducing impurities into a semiconductor substrate, in the manufacture of a semiconductor device, as in claim 14, wherein said impurity region is a graft base region of said semiconductor device.

* * * * *